US012622212B2

(12) United States Patent
Itatani et al.

(10) Patent No.: US 12,622,212 B2
(45) Date of Patent: May 5, 2026

(54) SUBSTRATE PROCESSING APPARATUS, METHOD OF MANUFACTURING SEMICONDUCTOR DEVICE, AND NON-TRANSITORY COMPUTER-READABLE RECORDING MEDIUM

(71) Applicant: Kokusai Electric Corporation, Tokyo (JP)

(72) Inventors: Hideharu Itatani, Toyama (JP); Naofumi Ohashi, Toyama (JP); Toshiro Koshimaki, Toyama (JP); Shun Matsui, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 743 days.

(21) Appl. No.: 17/942,839

(22) Filed: Sep. 12, 2022

(65) Prior Publication Data

US 2023/0085140 A1     Mar. 16, 2023

(30) Foreign Application Priority Data

Sep. 13, 2021    (JP) ................................. 2021-148962

(51) Int. Cl.
    *H10P 72/00*       (2026.01)
    *H10P 72/76*       (2026.01)

(52) U.S. Cl.
    CPC ...... *H10P 72/0616* (2026.01); *H10P 72/0402* (2026.01); *H10P 72/7614* (2026.01)

(58) Field of Classification Search
    CPC ......... H01L 21/67288; H01L 21/67017; H01L 21/6875; H01L 21/67748; H01L 21/68764; H01L 21/68771
    See application file for complete search history.

(56) References Cited

U.S. PATENT DOCUMENTS

| | | | | | |
|---|---|---|---|---|---|
| 5,843,232 | A | * | 12/1998 | Savkar | ...................... C23C 4/12 |
| | | | | | 118/712 |
| 6,124,927 | A | * | 9/2000 | Zhong | ...................... G01J 3/443 |
| | | | | | 118/712 |
| 6,395,563 | B1 | * | 5/2002 | Eriguchi | ............. G03F 7/70483 |
| | | | | | 356/908 |

(Continued)

FOREIGN PATENT DOCUMENTS

| | | |
|---|---|---|
| CN | 101826447 A | 9/2010 |
| CN | 112151423 A | 12/2020 |

(Continued)

OTHER PUBLICATIONS

Korean Office Action issued on Jul. 22, 2024 for Korean Patent Application No. 10-2022-0107516.

(Continued)

*Primary Examiner* — Mohammed Shamsuzzaman
(74) *Attorney, Agent, or Firm* — Volpe Koenig

(57) ABSTRACT

A substrate processing apparatus includes: a process chamber performing film-forming processing to a substrate; a substrate support that is provided in the process chamber and includes a plurality of mounting surfaces on which the substrate is mounted; and a detector that is disposed outside or inside the process chamber and detects a state of a film-forming material adhering to at least one of the plurality of mounting surfaces in a non-contact manner.

24 Claims, 11 Drawing Sheets

(56) References Cited

U.S. PATENT DOCUMENTS

| | | | | |
|---|---|---|---|---|
| 6,576,062 | B2 * | 6/2003 | Matsuse | C23C 16/45519 |
| | | | | 156/345.31 |
| 7,153,542 | B2 * | 12/2006 | Nguyen | H01L 21/6719 |
| | | | | 204/192.12 |
| 2001/0043984 | A1 * | 11/2001 | Otsubo | C23C 16/4401 |
| | | | | 427/248.1 |
| 2002/0142493 | A1 * | 10/2002 | Halliyal | C23C 14/547 |
| | | | | 118/712 |
| 2006/0073276 | A1 * | 4/2006 | Antonissen | C23C 16/45525 |
| | | | | 427/248.1 |
| 2007/0218702 | A1 * | 9/2007 | Shimizu | C23C 16/36 |
| | | | | 438/758 |
| 2010/0227046 | A1 * | 9/2010 | Kato | H01L 21/67253 |
| | | | | 118/712 |
| 2011/0300645 | A1 * | 12/2011 | Lee | H01L 21/6875 |
| | | | | 257/E21.53 |
| 2019/0360093 | A1 * | 11/2019 | Kato | H01L 21/68764 |

FOREIGN PATENT DOCUMENTS

| | | | | | |
|---|---|---|---|---|---|
| JP | S61272937 | A | * 12/1986 | ............. | H01L 21/31 |
| JP | H03276657 | A | * 12/1991 | ....... | H01L 21/67196 |
| JP | H09162165 | A | * 6/1997 | ............. | H01L 21/31 |
| JP | H1114312 | A | * 1/1999 | ....... | H01L 21/67196 |
| JP | H11121444 | A | * 4/1999 | ............. | H01L 21/31 |
| JP | H11297629 | A | * 10/1999 | ....... | H01L 21/67196 |
| KR | 10-2001-0106246 | A | 11/2001 | | |
| KR | 10-2010-0100633 | A | 9/2010 | | |
| KR | 20100100633 | A | * 9/2010 | ....... | H01L 21/67196 |

OTHER PUBLICATIONS

Chinese Office Action issued on Dec. 1, 2025 for Chinese Patent Application No. 202210926048.X.

* cited by examiner

*FIG. 2*

SUBSTRATE PROCESSING APPARATUS, METHOD OF MANUFACTURING SEMICONDUCTOR DEVICE, AND NON-TRANSITORY COMPUTER-READABLE RECORDING MEDIUM

FIELD

The present disclosure relates to a substrate processing apparatus, a method of manufacturing a semiconductor device, and a non-transitory computer-readable recording medium.

DESCRIPTION OF THE RELATED ART

In a substrate processing apparatus used in the semiconductor manufacturing field, film-forming processing is performed while heating a substrate mounted on a mounting surface with a heater.

However, in a film-forming processing step of the substrate, a film-forming material sneaks into the rear surface from the outer circumference of the substrate, and the film-forming material may adhere to the mounting surface. As described above, in a case where the film-forming material is deposited on the mounting surface, there is a concern that problems occur in the film-forming processing of the substrate. For this reason, the film-forming material deposited on the mounting surface is removed by regular maintenance.

SUMMARY

The present disclosure provides a technology of detecting a state of a mounting surface of a substrate.

According to one aspect of the present disclosure, there is provided a substrate processing apparatus, including: a process chamber performing film-forming processing to a substrate; a substrate support that is provided in the process chamber and includes a plurality of mounting surfaces on which the substrate is mounted; and a detector that is disposed outside or inside the process chamber and detects a state of a film-forming material adhering to at least one of the plurality of mounting surfaces in a non-contact manner.

BRIEF DESCRIPTION OF THE DRAWINGS

FIG. 2 is a schematic longitudinal sectional view of the reactor provided in the substrate processing apparatus of the first embodiment of the present disclosure, and is a 2X-2X-line sectional view of the reactor illustrated in FIG. 1.

DETAILED DESCRIPTION

Figure 1:
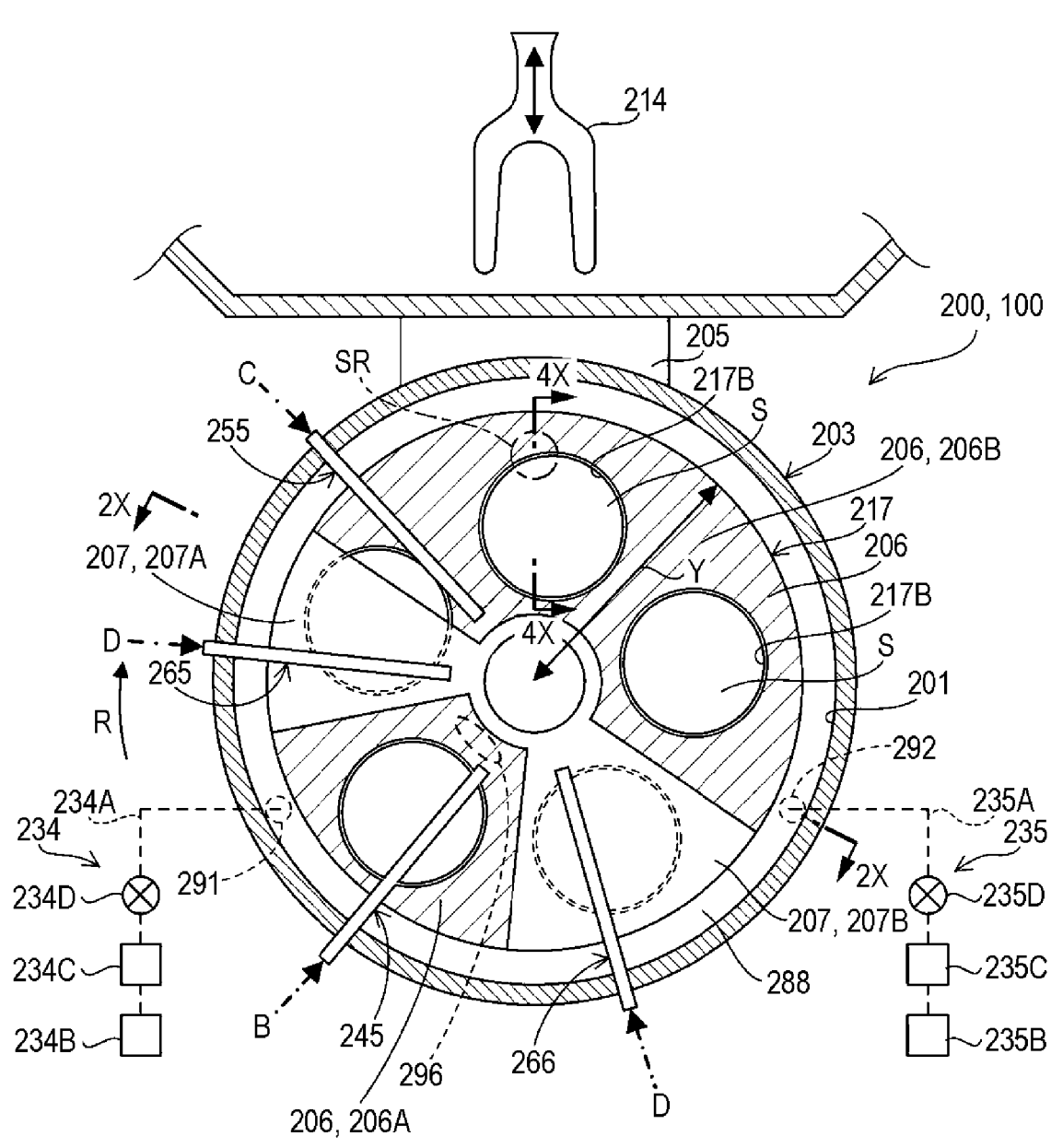
FIG. 1 is a schematic transverse sectional view of a reactor provided in a substrate processing apparatus of a first embodiment of the present disclosure.

Hereinafter, one embodiment of the present disclosure will be described with reference to the drawings. Note that, the drawings used in the following description are schematic views, illustrated in the drawings, dimensional relationships between elements, ratios of each of the elements, or the like are not necessarily coincident with the actual ones. In addition, even in a plurality of drawings, the dimensional relationships of the elements, the ratios of each of the elements, or the like are not coincident with each other.

First Embodiment

A substrate processing apparatus 100 of a first embodiment of the present disclosure is an apparatus used in a substrate processing step that is one step of a manufacturing step of a semiconductor device. Hereinafter, first, the configuration of the substrate processing apparatus 100 will be described, and then, the substrate processing step using the substrate processing apparatus 100 will be described.

Substrate Processing Apparatus

Figure 2:
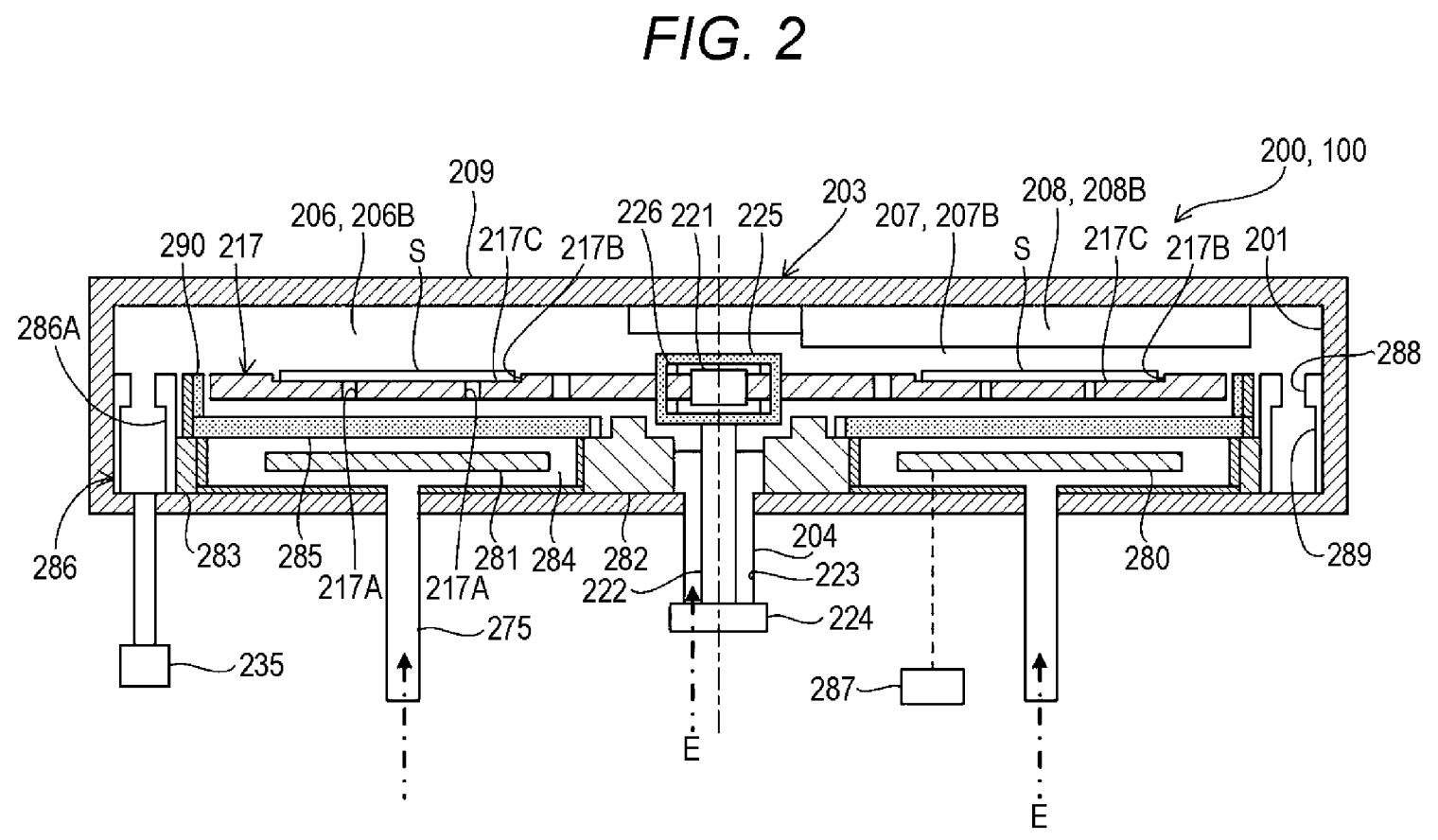
Figure 4:
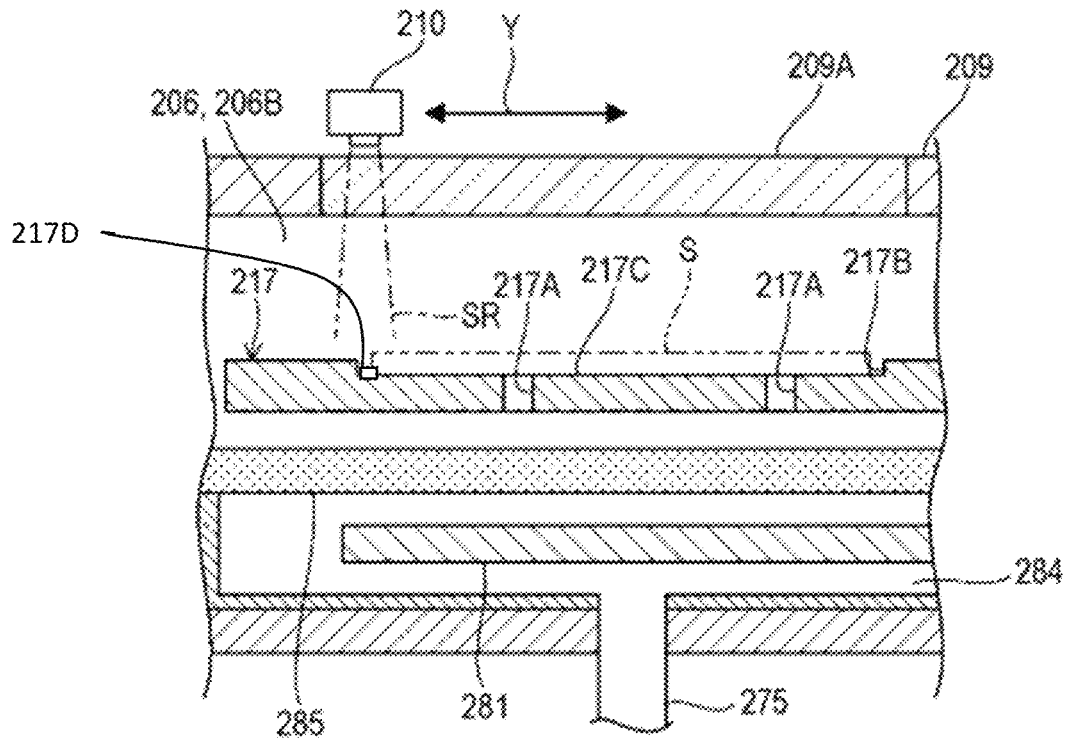
FIG. 4 is a 4X-4X-line sectional view of FIG. 1.

As illustrated in FIG. 1, the substrate processing apparatus 100 includes a reactor 200. As illustrated in FIG. 1 and FIG. 2, the reactor 200 includes a process chamber 201 performing film-forming processing to a substrate S, and a rotation table 217 as an example of a substrate support that is provided in the process chamber 201 and includes a plurality of mounting surfaces 217C on which the substrate S is mounted. In addition, as illustrated in FIG. 4, the reactor 200 includes a detector 210 detecting the state of a film-forming material 217D adhering to the mounting surface 217C in a non-contact manner. Note that, in the present disclosure, the 'film-forming material adhering to the mounting surface 217C' indicates at least one or more of an adsorbate of the material itself of processing gas, an adsorbate of substances generated by a reaction of the processing gas, a film formed by the deposition of the substances, and the like. In addition, the reaction of the processing gas indicates at least one or more of a decomposition reaction, a chemical reaction, and the like.

As illustrated in FIG. 1 and FIG. 2, the reactor 200 includes a process container 203 that is a tubular (as an example, a cylindrical) airtight container, and in the process container 203, the process chamber 201 for performing the film-forming processing to the substrate S is formed. In addition, the process container 203, for example, contains stainless steel (SUS), an aluminum alloy, or the like.

A gate valve 205 is connected to the process container 203. The substrate S is carried in and carried out from the process chamber 201 through the gate valve 205. Note that, an aperture of the process container 203 in which the gate valve 205 of this embodiment is provided is an example of a substrate carrying-out port in the present disclosure.

As illustrated in FIG. 1, the process chamber 201 includes a processing region 206 for supplying processing gas, and a purge region 207 for supplying purge gas. Here, the processing region 206 and the purge region 207 are alternately disposed in the shape of a circumference. For example, a first processing region 206A, a first purge region 207A, a second processing region 206B, and a second purge region 207B are disposed in this order. As described later, raw material gas is supplied into the first processing region 206A. In addition, reactant gas is supplied into the second processing region 206B. Then, inert gas is supplied into the first purge region 207A and the second purge region 207B. Accordingly, predetermined processing is performed to the substrate S, in accordance with the gas to be supplied into each of the regions.

The purge region 207 is a region spatially isolating the first processing region 206A and the second processing region 206B from each other. As illustrated in FIG. 2, a ceiling 208 of the purge region 207 is lower than a ceiling 209 of the processing region 206. A ceiling 208A is provided in the first purge region 207A, and a ceiling 208B (not illustrated) is provided in the second purge region 207B. By decreasing the height of each of the ceilings, the pressure of the space of the purge region 207 is increased. By supplying the purge gas to the space, the adjacent processing regions 206 are comparted. Note that, the purge gas also has a function of removing excess gas on the substrate S.

In the middle of the process container 203, for example, the rotation table 217 as an example of the substrate support that includes a rotation shaft in the center of the process container 203 and is configured to be rotatable is provided. The rotation table 217, for example, contains materials such as quartz, carbon, or SiC such that the substrate S is not affected by metal contamination.

The rotation table 217 is configured to support a plurality of (for example, five) substrates S at an interval and in parallel on the same surface and on the same circumference along a rotation direction in the process container 203. Here, the 'same surface' is not limited to completely the same surface, and the plurality of substrates S may be arranged not to overlap with each other when the rotation table 217 is seen from the top side.

A concave portion 217B serving as a mounting stage on which substrate S is mounted is provided in a support position of the substrate S in the surface of the rotation table 217. The same number of concave portions 217B as the number of substrates S to be processed are disposed at an interval in a concentric position from the center of the rotation table 217. Note that, in this embodiment, the plurality of concave portions 217B are disposed at an equal interval (for example, at an interval of 72°).

Each of the concave portions 217B, for example, has a circular shape when seen from the top side of the rotation table 217, and has a concave shape when seen from the lateral side. It is preferable that the diameter of the concave portion 217B is slightly greater than the diameter of the substrate S. The bottom surface of the concave portion 217B is the mounting surface 217C. Then, by mounting the substrate S in the concave portion 217B, the substrate S is mounted on the mounting surface 217C. In each of the concave portions 217B, a plurality of through-holes 217A to which pins 219 described below penetrate are provided.

Figure 3:
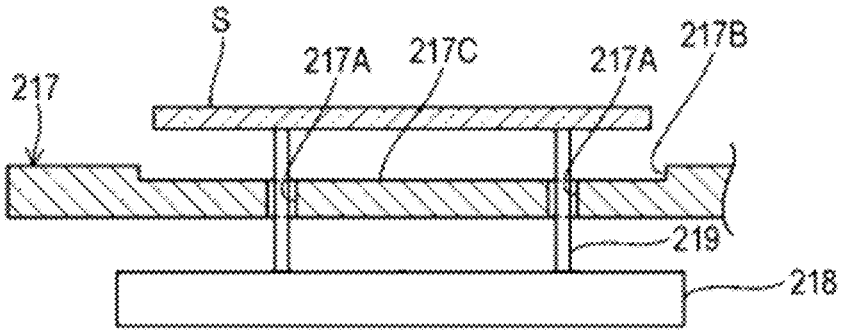
FIG. 3 is an explanatory diagram illustrating a substrate support mechanism of the first embodiment of the present disclosure.

As illustrated in FIG. 3, in the process container 203, a substrate retaining mechanism 218 is provided in a portion that is under the rotation table 217 and faces the gate valve 205. The substrate retaining mechanism 218 includes a plurality of pins 219 supporting the rear surface of the substrate S by thrusting up the substrate S when carrying in and carrying out the substrate S. The pin 219 is configured to be stretchable, and for example, can be stored in the main body of the substrate retaining mechanism 218. When transferring the substrate S, the pin 219 is stretched and penetrates to the through-hole 217A, and retains the substrate S. After that, by moving the head of the pin 219 downward, the substrate S is mounted in the concave portion 217B. The substrate retaining mechanism 218 is fixed to the process container 203, as an example. The substrate retaining mechanism 218 may be configured such that the pin 219 can be inserted to the through-hole 217A when mounting the substrate, and may be fixed to an inner-circumferential convex portion 282 or an outer-circumferential convex portion 283 described below.

The rotation table 217 is fixed to a core 221. The core 221 is provided in the center of the rotation table 217, and has a function of fixing the rotation table 217. Since the core 221 has a structure of supporting the rotation table 217, a metal that withstands the weight is used. A shaft 222 is disposed under the core 221. The shaft 222 supports the core 221.

The lower side of the shaft 222 is covered with a container 204 that penetrates to a hole 223 provided in the bottom of the process container 203 and can be airtight outside the process container 203. In addition, the lower end of the shaft 222 is connected to a rotator 224. The rotator 224 is equipped with a rotation shaft, a motor, or the like, and is configured to be capable of rotating the rotation table 217 in accordance with an instruction of a controller 300 serving as a controller described below. That is, the controller 300 allows the substrate S to sequentially pass through the first processing region 206A, the first purge region 207A, the second processing region 206B, and the second purge region 207B in this order by the rotator 224 rotating the rotation table 217 around the core 221 that is one point outside the substrate S.

A quartz cover 225 is provided to cover the core 221. That is, the quartz cover 225 is provided between the core 221 and the process chamber 201. The quartz cover 225 is configured to cover the core 221 through a space. The quartz cover 225, for example, contains materials such as quartz or SiC such that the substrate S is not affected by the metal contamination. The core 221, the shaft 222, the rotator 224, and the quartz cover 225 are collectively referred to as a support.

A heater unit 281 including a heater 280 serving as a heater is disposed under the rotation table 217. The heater 280 heats each of the substrates S mounted on the rotation table 217. The heater 280 is configured into the shape of a circumference along the shape of the process container 203.

The heater unit 281 mainly includes the inner-circumferential convex portion 282 provided on the bottom of the process container 203 and on the center side of the process container 203, the outer-circumferential convex portion 283 disposed on the outer circumference side from the heater 280, and the heater 280. The inner-circumferential convex portion 282, the heater 280, and the outer-circumferential convex portion 283 are concentrically disposed. A space 284 is formed between the inner-circumferential convex portion 282 and the outer-circumferential convex portion 283. The heater 280 is disposed in the space 284. The inner-circumferential convex portion 282 and the outer-circumferential convex portion 283 are fixed to the process container 203, and thus, may be considered as a part of the process container 203.

Here, the circumferential heater 280 has been described, but the heater 280 is not limited thereto insofar as the heater 280 is capable of heating the substrate S, and a structure including a plurality of divided heaters may be used. In addition, a structure may be used in which the heater 280 is included in the rotation table 217.

A flange (not illustrated) is formed on the upper side inner-circumferential convex portion 282 and on the heater 280 side. A window 285 is supported on the upper surface of a flange 282A and the outer-circumferential convex portion 283. The window 285 contains a material that transmits heat generated from the heater 280, and for example, contains quartz. The window 285 is fixed by being interposed between a top 286A of an exhaust structure 286 described below and the inner-circumferential convex portion 282.

A heater controller 287 is connected to the heater 280. The heater 280 is electrically connected to the controller 300 described below, serving as the controller, controls power supply to the heater 280 in accordance with the instruction of the controller 300, and performs temperature control.

An inert gas supply pipe 275 communicating with the space 284 is provided on the bottom of the process container 203. The inert gas supply pipe 275 is connected to a second inert gas supplier 270 described below. The inert gas supplied from the second inert gas supplier 270 is supplied to the space 284 through the inert gas supply pipe 275. By setting the space 284 to be an inert gas atmosphere, it is possible to prevent the processing gas from being infiltrated from a gap or the like in the vicinity of the window 285.

A metal exhaust structure 286 is disposed between the outer circumferential surface of the outer-circumferential convex portion 283 and the inner circumferential surface of the process container 203. The exhaust structure 286 includes an exhaust groove 288 and an exhaust buffer space 289. The exhaust groove 288 and the exhaust buffer space 289 are configured into the shape of a circumference along the shape of the process container 203.

A portion in the exhaust structure 286 that is in contact with the outer-circumferential convex portion 283 is referred to as the top 286A. As described above, the top 286A is fixed to the window 285 together with the inner-circumferential convex portion 282.

In such a rotary substrate processing apparatus of this embodiment, it is desirable that the height of the substrate S and the height of an exhaust port are the same height or close to each other. As described above, by setting the height of the substrate S and the height of the exhaust port to be the same or close to each other, the occurrence of turbulent flow on the substrate edge on the exhaust port side can be suppressed.

In this embodiment, the upper end of the exhaust structure 286 has the same height as that of the rotation table 217. In this case, as illustrated in FIG. 2, since the top 286A is a portion protruding from the window 285, a quartz cover 290 is provided in the protruding portion from the viewpoint of preventing particle diffusion. A space is provided between the quartz cover 290 and the top 286A.

An exhaust port 291 serving as a first exhauster, and an exhaust port 292 are provided on the bottom of the exhaust structure 286. The exhaust port 291 mainly exhausts the raw material gas to be supplied to the first processing region 206A, and the purge gas to be supplied from the upstream thereof. The exhaust port 292 mainly exhausts the reactant gas to be supplied to the processing region 206B, and the purge gas to be supplied from the upstream thereof. Each gas is exhausted from the exhaust port 291 and the exhaust port 292 through the exhaust groove 288 and the exhaust buffer space 289.

Next, a raw material gas supplier 240 will be described by using FIG. 1 and FIG. 5. As illustrated in FIG. 1, a nozzle 245 extending toward a center direction of the process container 203 is inserted to the lateral side of the process container 203. The nozzle 245 is disposed in the first processing region 206A. The downstream end of the gas supply pipe 241 is connected to the nozzle 245. The details of the nozzle 245 will be described below.

In the gas supply pipe 241, a raw material gas supply source 242, a mass flow controller (MFC) 243 that is a flow rate controller, and a valve 244 that is an on-off valve are provided in this order from an upstream direction.

The raw material gas is supplied into the first processing region 206A from the nozzle 245 through the MFC 243, the valve 244, and the gas supply pipe 241.

Here, the 'raw material gas' is one of the processing gases, and is gas to be a raw material when forming a thin film. The raw material gas, for example, contains at least one of silicon (Si), titanium (Ti), tantalum (Ta), hafnium (Hf), zirconium (Zr), ruthenium (Ru), nickel (Ni), tungsten (W), and molybdenum (Mo), as an element configuring the thin film. Note that, the raw material gas of this embodiment is an example of the film-forming material of the present disclosure.

Specifically, in this embodiment, the raw material gas, for example, is dichlorosilane ($Si_2H_2Cl_2$) gas. In a case where the raw material of the raw material gas is gas at a normal temperature, the MFC 243 is a mass flow controller for gas.

The raw material gas supplier (may be referred to as a first gas supplier or a raw material gas supplier) 240 mainly includes the gas supply pipe 241, the MFC 243, the valve 244, and the nozzle 245. Note that, it may be considered that the raw material gas supply source 242 is included in the raw material gas supplier 240.

Figure 6:
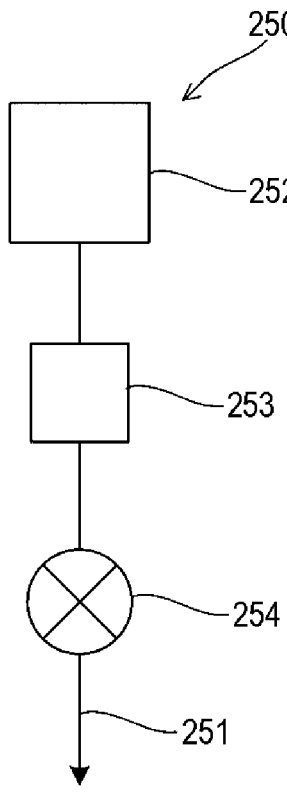
FIG. 6 is an explanatory diagram describing a reactant gas supplier of the first embodiment of the present disclosure.

Next, a reactant gas supplier 250 will be described by using FIG. 1 and FIG. 6. As illustrated in FIG. 1, a nozzle 255 extending toward the center direction of the process container 203 is inserted to the lateral side of the process container 203. The nozzle 255 is disposed in the second processing region 206B.

The downstream end of the gas supply pipe 251 is connected to the nozzle 255. In the gas supply pipe 251, a reactant gas supply source 252, an MFC 253, and a valve 254 are provided in this order from the upstream direction.

The reactant gas is supplied into the second processing region 206B from the nozzle 255 through the MFC 253, the valve 254, and the gas supply pipe 251.

Here, the 'reactant gas' is one of the processing gases, and is gas that reacts with a first layer formed on the substrate S by the raw material gas reaction. The reactant gas, for example, is at least one of ammonia ($NH_3$) gas, nitrogen ($N_2$) gas, hydrogen ($H_2$) gas, and oxygen ($O_2$) gas. Here, the reactant gas, for example, is $NH_3$ gas.

The reactant gas supplier (a second gas supplier) 250 mainly includes the gas supply pipe 251, the MFC 253, the valve 254, and the nozzle 255. Note that, it may be considered that the reactant gas supply source 252 is included in the reactant gas supplier 250.

Figure 7:
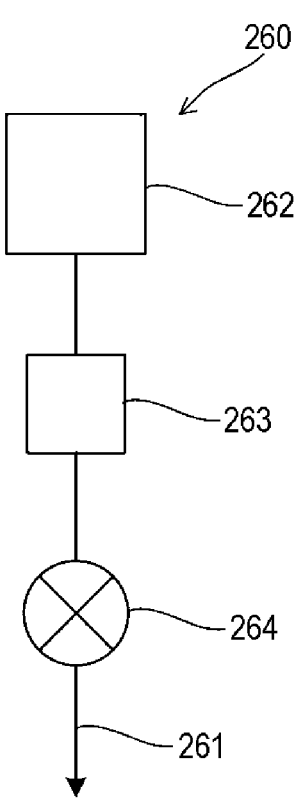
FIG. 7 is an explanatory diagram describing a first inert gas supplier of the first embodiment of the present disclosure.

Next, a first inert gas supplier 260 will be described by using FIG. 1 and FIG. 7. As illustrated in FIG. 1, a nozzle 265 and a nozzle 266 extending toward the center direction of the process container 203 are inserted to the lateral side of the process container 203. The nozzle 265 is a nozzle that is inserted to the first purge region 207A. The nozzle 265, for example, is fixed to the ceiling 208A of the first purge region 207A. The nozzle 266 is a nozzle that is inserted to the second purge region 207B. The nozzle 266, for example, is fixed to the ceiling 208B (not illustrated) of the second purge region 207B.

The downstream end of the inert gas supply pipe 261 is connected to the nozzle 265 and the nozzle 266. In the inert gas supply pipe 261, an inert gas supply source 262, an MFC 263, and a valve 264 are provided in this order from the upstream direction. The inert gas is supplied into each of the first purge region 207A and the second purge region 207B from the nozzle 265 and the nozzle 266 through the MFC 263, the valve 264, and the inert gas supply pipe 261. The inert gas to be supplied into the first purge region 207A and the second purge region 207B functions as the purge gas.

The first inert gas supplier mainly includes the inert gas supply pipe 261, the MFC 263, the valve 264, the nozzle 265, and the nozzle 266. Note that, it may be considered that the inert gas supply source 262 is included in the first inert gas supplier.

Figure 8:
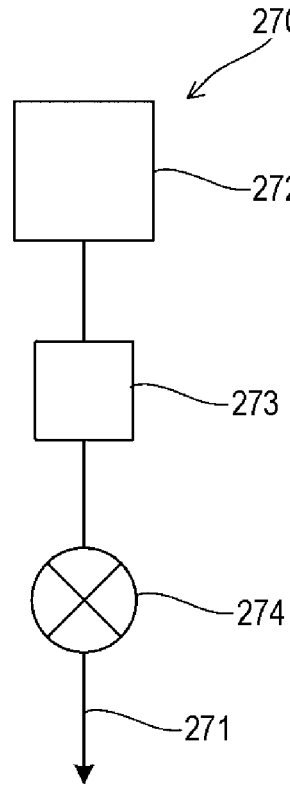
FIG. 8 is an explanatory diagram describing a second inert gas supplier of the first embodiment of the present disclosure.

Next, a second inert gas supplier 270 will be described by using FIG. 2 and FIG. 8. The downstream end of the inert gas supply pipe 271 is connected to the inert gas supply pipe 275. In the inert gas supply pipe 271, an inert gas supply source 272, an MFC 273, and a valve 274 are provided in this order from the upstream direction. The inert gas is supplied to the space 284 and the container 204 from the inert gas supply pipe 275 through the MFC 273, the valve 274, and the inert gas supply pipe 271.

The inert gas supplied to the container 204 is exhausted from the exhaust groove 288 through a space between the rotation table 217 and the window 285. According to such a structure, it is possible to prevent the raw material gas or the reactant gas from sneaking into the space between the rotation table 217 and the window 285.

The second inert gas supplier 270 mainly includes the inert gas supply pipe 271, the MFC 273, the valve 274, and the inert gas supply pipe 275. Note that, it may be considered that the inert gas supply source 272 is included in the second inert gas supplier 270.

Here, the 'inert gas', for example, is at least one of rare gas such as nitrogen ($N_2$) gas, helium (He) gas, neon (Ne) gas, and argon (Ar) gas. Here, the inert gas, for example, is $N_2$ gas.

Figure 5:
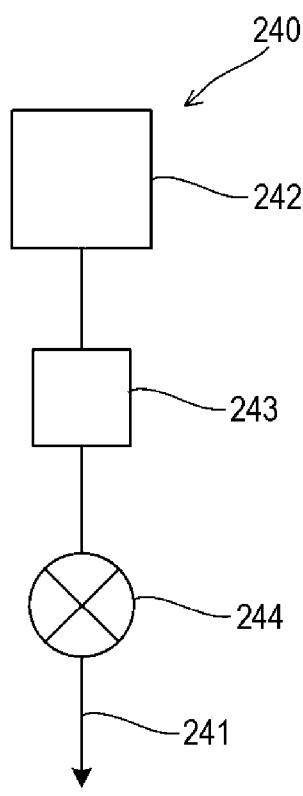
FIG. 5 is an explanatory diagram describing a raw material gas supplier of the first embodiment of the present disclosure.

As illustrated in FIG. 1, FIG. 2, and FIG. 5, the exhaust port 291 and the exhaust port 292 are provided in the process container 203. In addition, an exhaust port 296 is provided in the rotation table 217.

The exhaust port 291 is provided on the outside from the rotation table 217 on the downstream side of a rotation direction R of the first processing region 206A (a rotation direction of the rotation table 217). The exhaust port 291 mainly exhausts the raw material gas and the inert gas. An exhaust pipe 234A that is a part of an exhauster 234 is provided to communicate with the exhaust port 291. A vacuum pump 234B serving as a vacuum exhaust is connected to the exhaust pipe 234A, through a valve 234D serving as an on-off valve and an auto pressure controller (APC) valve 234C serving as a pressure regulator, and is configured to be capable of performing vacuum exhaust such that a pressure in the process chamber 201 is a predetermined pressure (vacuum degree).

The exhaust pipe 234A, the valve 234D, and the APC valve 234C are collectively referred to as the exhauster 234. Note that, the vacuum pump 234B may be included in the exhauster 234.

The exhaust port 296 is provided on the center side of the process chamber 201 from the concave portion 217B of the rotation table 217 on which the substrate S is mounted. By providing the exhaust port 296, the gas supplied to the center side of the rotation table 217 is exhausted to a space under the rotation table 217 from the exhaust port 296. The gas exhausted to the space under the rotation table 217 is exhausted through the exhaust port 291 provided outside the process chamber 201. The exhaust port 296 communicates with the space between the rotation table 217 and the window 285, and mainly exhausts the raw material gas and the inert gas.

In addition, as illustrated in FIG. 1 and FIG. 2, an exhauster 235 is provided to communicate with the exhaust port 292. The exhaust port 292 is provided on the outside from the rotation table 217 on the downstream side in the rotation direction R of the second processing region 206B. The exhaust port 292 mainly exhausts the reactant gas and the inert gas.

An exhaust pipe 235A that is a part of the exhauster 235 is provided to communicate with the exhaust port 292. A vacuum pump 235B is connected to the exhaust pipe 235A through a valve 235D and an APC valve 235C, and is configured to be capable of performing the vacuum exhaust such that the pressure in the process chamber 201 is the predetermined pressure (vacuum degree).

The exhaust pipe 235A, the valve 235D, and the APC valve 235C are collectively referred to as the exhauster 235. Note that, the vacuum pump 235B may be included in the exhauster 235.

As described above, the reactor 200 includes the detector 210 described below that detects the state of the film-forming material (film) adhering to the mounting surface 217C in a non-contact manner. Specifically, the detector 210 detects the state (for example, a film thickness distribution, a crack generation situation, or the like) of the film-forming material adhering to (remaining on) the mounting surface 217C after the film-forming processing of the substrate S. More specifically, the detector 210 is configured to detect film deposition image information (film thickness image information) of the film-forming material adhering to the mounting surface 217C. That is, the detector 210 is a capturer (hereinafter, suitably referred to as a 'camera') obtaining the film deposition image information by capturing the mounting surface 217C. As an example, in this embodiment, a hyperspectral camera is used as the detector 210, but the present disclosure is not limited thereto. Note that, the film deposition image information that is detected by the detector 210 is information including image information of the film-forming material adhering to the mounting surface 217C and wavelength information. In addition, the film deposition image information as detection information that is detected by the detector 210 is transmitted to the controller 300 serving as the controller described below.

As illustrated in FIG. 1 and FIG. 4, the detector 210 is disposed outside the process chamber 201, that is, outside the process container 203. Specifically, the detector 210 is disposed above the ceiling 209. A window 209A is provided in the ceiling 209. The window 209A is provided in a position close to the gate valve 205 in the ceiling 209. Specifically, the window 209A extends toward the center side of the process container 203 from the gate valve 205 side of the ceiling 209. That is, the window 209A extends along a radial direction of the process container 203. The window 209A, for example, contains quartz or the like. For this reason, the detector 210 is capable of capturing the inside of the process chamber 201 through the window 209A.

Figure 9:
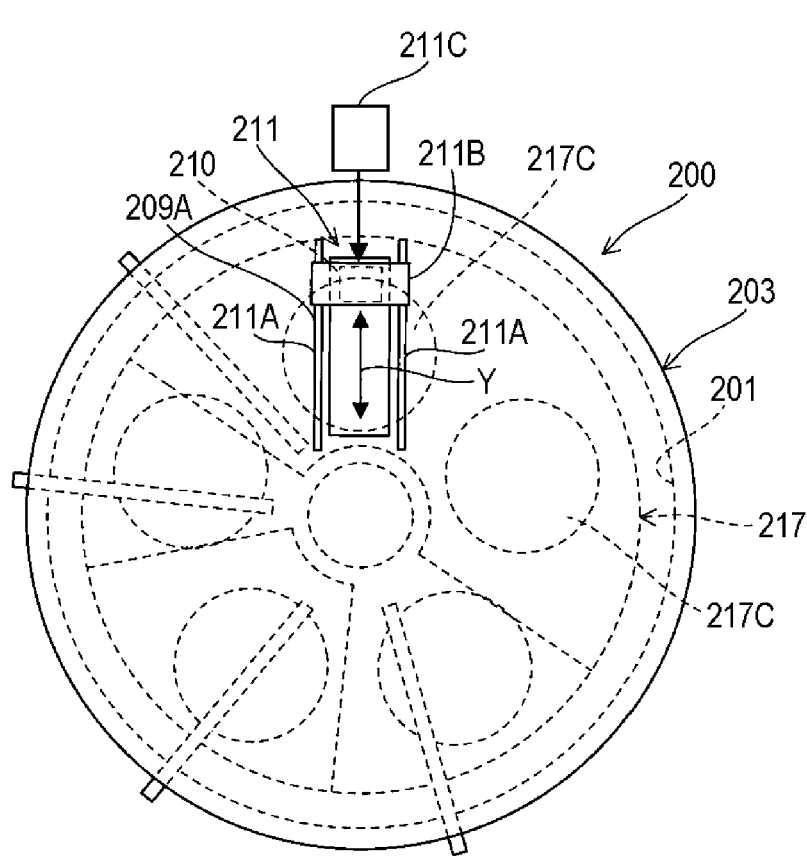
FIG. 9 is an explanatory diagram describing a movement mechanism of a camera of the first embodiment of the present disclosure.

As illustrated in FIG. 4 and FIG. 9, the detector 210 is configured to be movable in a direction orthogonal to the rotation shaft of the rotation table 217, that is, a radial direction of the rotation table 217. Specifically, the detector 210 is configured to be movable along an extending direction of the window 209A. Here, the detector 210 is moved in the radial direction of the rotation table 217 by a movement mechanism 211. The movement mechanism 211 includes a pair of guide rails 211A provided on both sides of the window 209A by interposing the window 209A therebetween, a moving block 211B that is guided and moved by the pair of guide rails 211A, and an applier 211C applying a moving force to the moving block 211B. The length of the pair of guide rails 211A is longer than the length of the window 209A. In addition, the detector 210 is attached to the lower surface of moving block 211B. Then, the applier 211C is an electrical actuator that moves the moving block 211B in the radial direction of the rotation table 217, and is controlled by the controller 300. Here, the detector 210 is capable of detecting the film t deposition image information of the mounting surface 217C through the window 209A while being moved by the movement mechanism 211.

Figure 10:
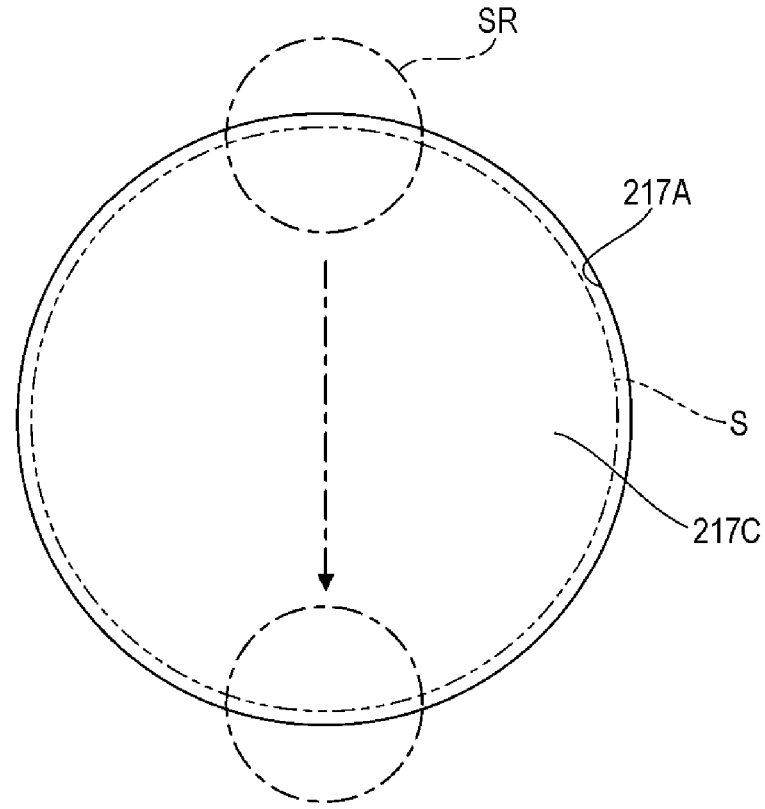
FIG. 10 is an explanatory diagram for describing a capturing region of the camera of the first embodiment of the present disclosure.

In addition, the detector 210 is moved toward the rotation shaft of the rotation table 217 from the detection start position (a position in FIG. 9). Here, when the detector 210 is in the detection start position, a portion outside the radial direction of the rotation table 217 on the outer circumference of the mounting surface 217C is included in a detection region SR of the detector 210 (in other words, a capturing region) (refer to FIG. 10). In other words, the detector 210 is disposed in a position in which the portion outside the radial direction of the rotation table 217 on the outer circumference of the mounting surface 217C is included in the detection region SR when starting the detection. Then, the detector 210 is moved along the radial direction of the rotation table 217, and when the detector 210 is in a turning-back position, a portion inside (on the center side of) the radial direction of the rotation table 217 on the outer circumference of the mounting surface 217C is included in the detection region SR (refer to FIG. 10). In other words, the detector 210 is disposed in a position in which the portion inside the radial direction of the rotation table 217 on the outer circumference of the mounting surface 217C is included in the detection region SR when turning back.

In addition, the detector 210 is disposed in the position close to the gate valve 205 when starting the detection. That is, when the detector 210 is in the detection start position, the detector 210 is close to the gate valve 205.

Figure 11:
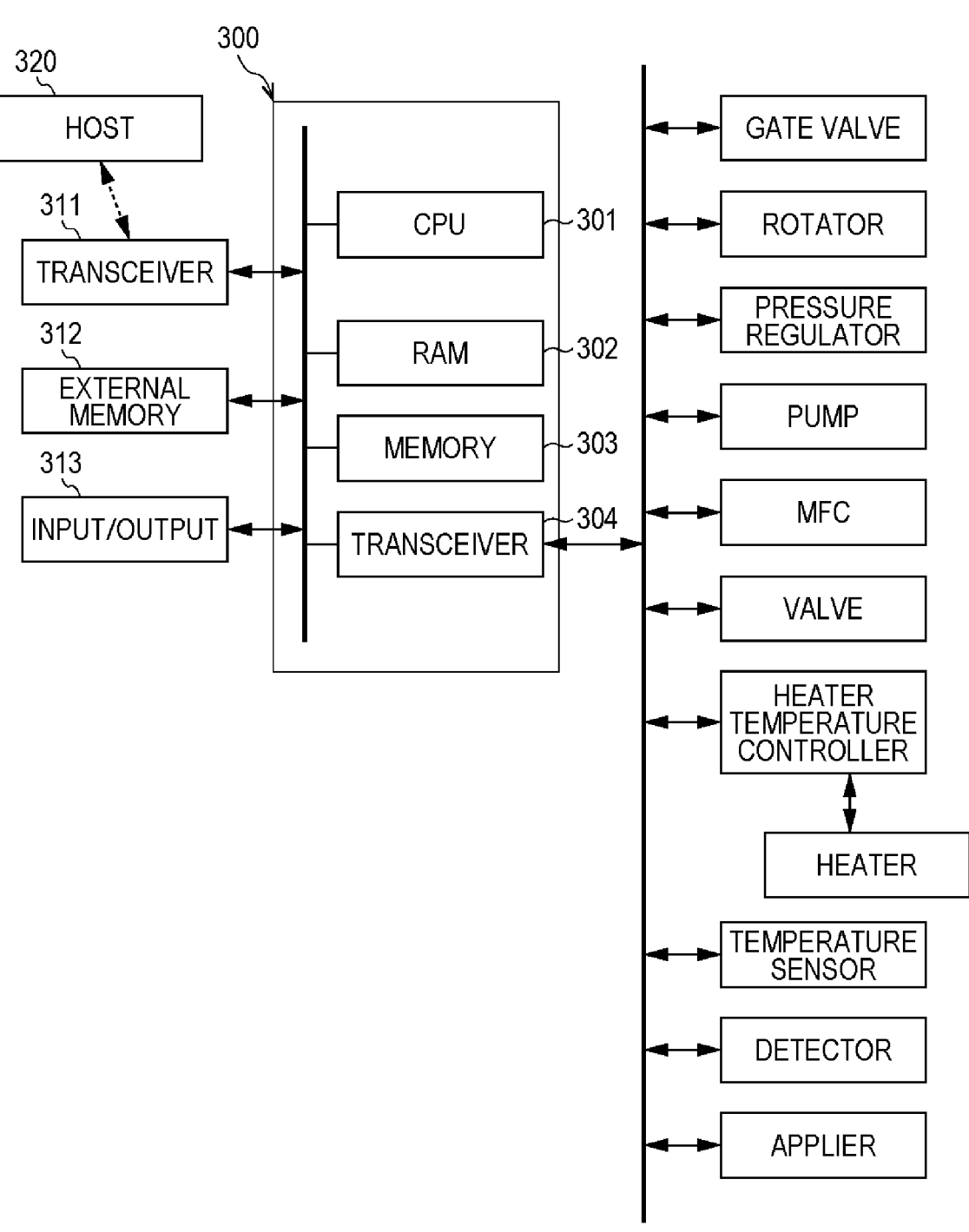
FIG. 11 is an explanatory diagram describing a controller of the first embodiment of the present disclosure.

The reactor 200 includes the controller 300 configured to be capable of controlling the operation of each configuration. As illustrated in FIG. 11, the controller 300 includes at least a calculator (CPU) 301, a RAM 302 serving as a transitory memory, a memory 303, and a transceiver 304. The controller 300 is connected to each configuration of the substrate processing apparatus 100 through the transceiver 304, calls out a program or a recipe from the memory 303 in accordance with an instruction of a host controller or a user, and controls the operation of each configuration in accordance with the contents thereof. Note that, the controller 300 may be configured as a dedicated computer, or may be configured as a general-purpose computer. For example, the controller 300 according to this embodiment can be configured by preparing an external memory (for example, a magnetic disk such as a magnetic tape, a flexible disk, or a hard disk, an optical disk such as a CD or a DVD, a magneto-optical disk such as an MO, and a semiconductor memory such as a USB memory (a USB flash drive) or a memory card) 312 storing the program described above, and by installing the program in a general-purpose computer using the external memory 312. In addition, a method of supplying the program to the computer is not limited to a case of supplying the program through the external memory 312. For example, communication tools such as the internet or a dedicated line may be used, or information may be received from a host 320 through a transceiver 311, and the program may be supplied without using the external memory 312. In addition, the instruction may be given to the controller 300 by using an input/output 313 such as a keyboard or a touch panel. In addition, the program including the maintenance program of the present disclosure may be edited by the input/output 313, and the edited program may be stored in the memory 303.

Note that, the memory 303 or the external memory 312 is configured as a non-transitory computer-readable recording medium. Hereinafter, the memory 303 and the external memory 312 will be collectively referred to simply are the non-transitory computer-readable recording medium. Note that, herein, in a case of using the term of the non-transitory computer-readable recording medium, there is a case of including a single memory 303, a case of including a single external memory 312, or a case of including both of the memory 303 and the external memory 312.

The CPU 301 is configured to read out and execute a control program (including the maintenance program) from the memory 303, and to read out a process recipe from the memory 303 in accordance with the input of an operation command from the input/output 313, or the like. Then, the CPU 301 is configured to control each component to conform the contents of the read process recipe.

Substrate Processing Step

Figure 12:
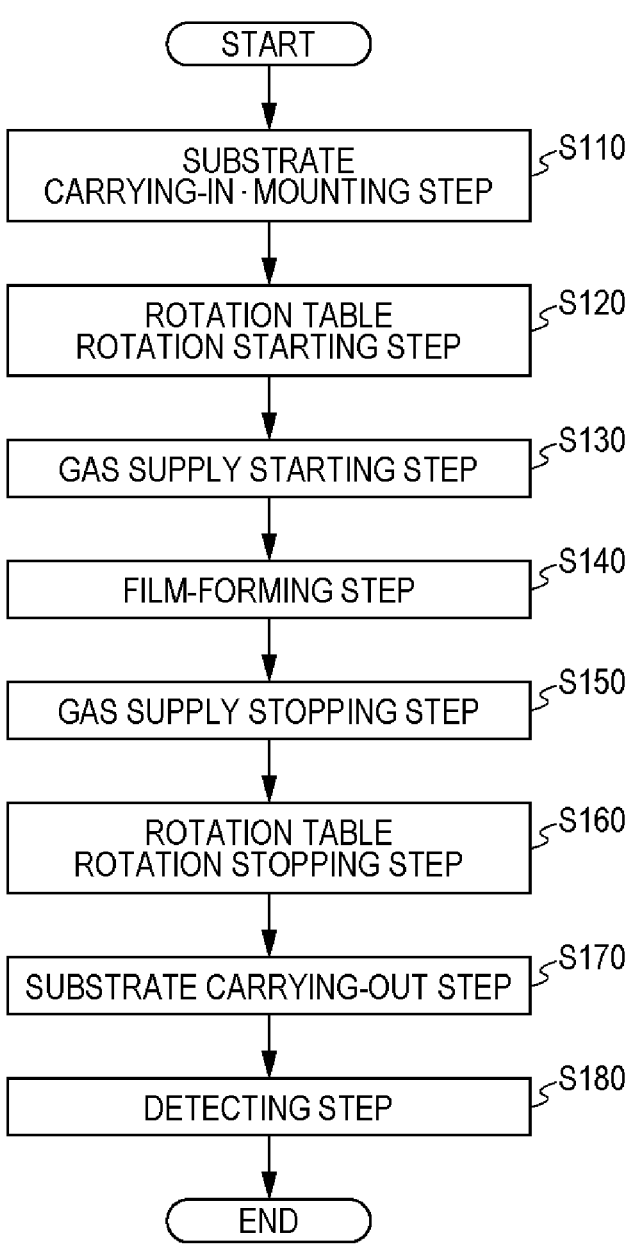
FIG. 12 is a flowchart describing a substrate processing step of the first embodiment of the present disclosure.

Next, a substrate processing step according to the first embodiment will be described by using FIG. 12. FIG. 12 is a flowchart illustrating the substrate processing step according to this embodiment. In the following description, the operation of each configuration of the reactor 200 of the substrate processing apparatus 100 is controlled by the controller 300.

Here, an example will be described in which $Si_2H_2Cl_2$ gas is used as the raw material gas, $NH_3$ gas is used as the reactant gas, and a silicon nitride (SiN) film is formed on the substrate S as the thin film.

A substrate carrying-in mounting step S110 will be described. In the reactor 200, the pin 219 is lifted, and the pin 219 penetrates to the through-hole 217A of the rotation table 217. As a result thereof, the pin 219 protrudes from the surface of the rotation table 217 by a predetermined height. Subsequently, the gate valve 205 is opened, and as illustrated in FIG. 3, the substrate S is mounted on the pin 219 by using a substrate transferor 214 as an example of a transferor. After mounting the substrate S, the pin 219 is lowered, and the substrate S is mounted on the concave portion 217B.

Then, the rotation table 217 is rotated such that the concave portion 217B in which the substrate S is not mounted faces the gate valve 205. After that, similarly, the substrate S is mounted in the concave portion 217B. Such an operation is repeated until the substrate S is mounted in all of the concave portions 217B.

After the substrate S is carried in the concave portion 217B, the substrate transferor 214 is retracted to the outside of the reactor 200, and the process container 203 is sealed by closing the gate valve 205.

Note that, when carrying the substrate S into the process chamber 201, it is preferable to supply $N_2$ gas as the inert gas into the process chamber 201 from the first inert gas supplier 260 while exhausting the process chamber 201 with the exhausters 234 and 235. Accordingly, it is possible to prevent the particles from being infiltrated into the process chamber 201 or the particles from adhering onto the substrate S. The vacuum pumps 234B and 235B are constantly operated until at least the substrate carrying-in mounting step (S110) to a substrate carrying-out step (S170) described below are ended.

When mounting the substrate S on the rotation table 217, the power is supplied in advance to the heater 280, and control is performed such that the surface of the substrate S is at a predetermined temperature. The temperature of the substrate S, for example, is a room temperature or more and 650° C. or less, and preferably a room temperature or more and 400° C. or less. The heater 280 is constantly energized until at least the substrate carrying-in mounting step (S110) to the substrate carrying-out step (S170) described below are ended.

In addition, the inert gas is supplied to the process container 203 and the heater unit 281 from the second inert gas supplier 270. The inert gas is supplied until at least the substrate carrying-in mounting step (S110) to the substrate carrying-out step (S170) described below are ended.

A rotation table rotation starting step S120 will be described. After the substrate S is mounted in each of the concave portions 217B, the rotator 224 is controlled by the controller 300 such that the rotator 224 rotate the rotation table 217 in the direction R. By rotating the rotation table 217, the substrate S is moved to the first processing region 206A, the first purge region 207A, the second processing region 206B, and the second purge region 207B in this order.

A gas supply starting step S130 will be described. After the substrate S reaches a desired temperature by being heated, and the rotation table 217 reaches a desired rotation rate, the supply of the $Si_2H_2Cl_2$ gas into the first processing region 206A is started by opening the valve 244. In addition, the $NH_3$ gas is supplied into the second processing region 206B by opening the valve 254.

In this case, the MFC 243 is regulated such that a flow rate of the $Si_2H_2Cl_2$ gas is a predetermined flow rate. Note that, a supply flow rate of the $Si_2H_2Cl_2$ gas, for example, is 50 sccm or more and 500 sccm or less.

In addition, the MFC 253 is regulated such that a flow rate of the $NH_3$ gas is a predetermined flow rate. Note that, a supply flow rate of the $NH_3$ gas, for example, is 100 sccm or more and 5000 sccm or less.

Note that, after the substrate carrying-in mounting step S110, subsequently, the process chamber 201 is exhausted by the exhausters 234 and 235, and the $N_2$ gas as the purge gas is supplied into the first purge region 207A and into the second purge region 207B from the first inert gas supplier 260. In addition, by suitably regulating the degree of valve opening of the APC valve 234C and the APC valve 235C, the pressure in the process chamber 201 is set to the predetermined pressure.

A film-forming step S140 will be described. In the film-forming step S140, in each of the substrates S, a silicon-containing layer is formed in the first processing region 206A, the silicon-containing layer and the $NH_3$ gas react with each other in the second processing region 206B after the rotation, and the SiN film is formed on the substrate S. The rotation table 217 is rotated predetermined times to have a desired thickness of film.

A gas supply stopping step S150 will be described. After performing the rotation the predetermined times, the supply of the $Si_2H_2Cl_2$ gas to the first processing region 206A and the supply of the $NH_3$ gas to the second processing region 206B are stopped by closing the valve 244 and the valve 254.

A rotation table rotation stopping step S160 will be described. After the gas supply stopping step S150, the rotation of the rotation table 217 is stopped.

The substrate carrying-out step S170 will be described. The rotation table 217 is rotated such that the substrate S is moved to a position facing the gate valve 205. After that, as with when carrying the substrate in the process chamber 201, the substrate S is supported on the pin 219. After supporting the substrate S, the gate valve 205 is opened, and the substrate S is carried out to the outside of the process container 203 by using the substrate transferor 214. Such an operation is repeated for the number of processed substrates S, and all of the substrates S are carried out from the process container 203. After carrying out the substrate S from the process container 203, the supply of the inert gas by the first inert gas supplier 260 and the second inert gas supplier 270 is stopped.

Figure 13:
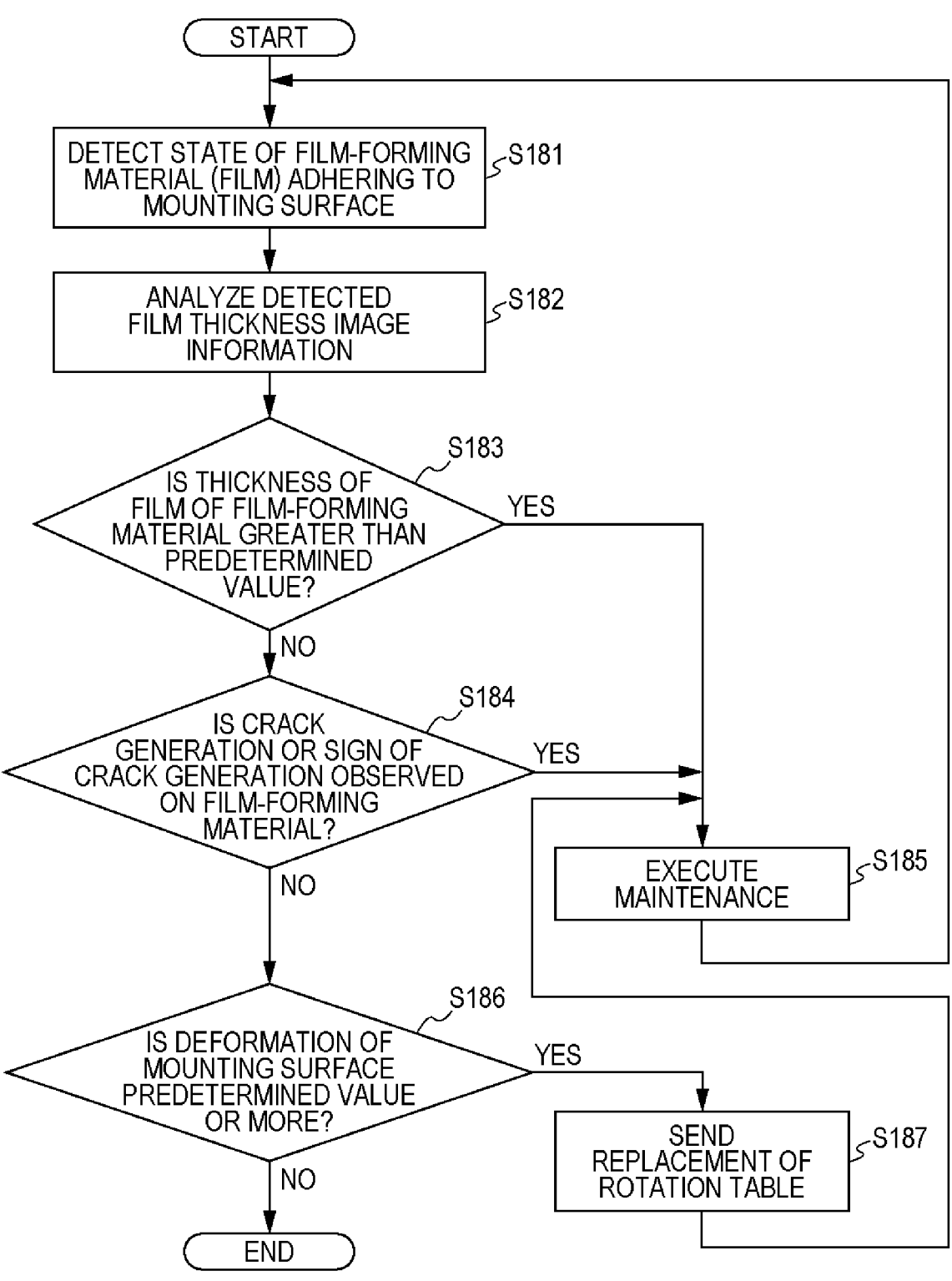
FIG. 13 is a flowchart describing a detecting step of the first embodiment of the present disclosure.

A detecting step S180 will be described. In the detecting step S180, the state of the film-forming material adhering to the mounting surface 217C is detected. Note that, the details of the detecting step S180 are illustrated in FIG. 13. First, the state (the film deposition image information) of the film-forming material adhering to the mounting surface 217C is detected by using the detector 210 (step S181). Specifically, the rotation table 217 is rotated such that the first concave portion 217B is moved to the position facing the gate valve 205. After that, in a state where the rotation table 217 is stopped, the detector 210 is moved in the radial direction of the rotation table 217 by operating the movement mechanism 211. With the movement, the film deposition image information of the film-forming material adhering to the first mounting surface 217C is continuously detected (acquired) by the detector 210. After the detector 210 reaches the turning back position, the rotation table 217 stops the rotation table 217 by rotating the rotation table 217 at a predetermined angle. Then, the film deposition image information of the film-forming material adhering to the first mounting surface 217C is continuously detected (acquired) by the detector 210 while moving the detector 210 to the start position from the turning back position. As described above, a high-accuracy film thickness distribution of the film-forming material can be obtained by acquiring the film deposition image information of the film-forming material adhering to the mounting surface 217C. After acquiring the film deposition image information of the film-forming material adhering to the mounting surface 217C of the first concave portion 217B, the rotation table 217 is rotated such that the second concave portion 217B is moved to the position facing the gate valve 205, and the film deposition image information of the film-forming material adhering to the mounting surface 217C of the second concave portion 217B is acquired by the same method as that of the first concave portion 217B. After the controller 300 acquires the film deposition image information of the film-forming material adhering to all of the mounting surfaces 217C, and the process proceeds to step S182.

Next, in step S182, the film deposition image information detected in step S181 is analyzed. Specifically, in the film deposition image information, crack generation on a film or the sign of the crack generation is obtained from the image information. Here, the sign of the crack generation is determined by whether or not a fine crack, a crease, or the like is generated on the edge of the film-forming material. In addition, the deformation of the mounting surface 217C is obtained by obtaining a distance between the ceiling 209 and the mounting surface 217C and a distance between the ceiling 209 and a portion other than the mounting surface 217C from the image information. Then, the film thickness distribution of the film-forming material is obtained from the wavelength information. Here, the deformation of the mounting surface 217C indicates at least the flatness of the mounting surface 217C. A film deposited on the mounting surface 217C is thickly formed in a portion in the mounting surface 217C in which a wafer is not mounted. Accordingly, a portion in the mounting surface 217C in which the wafer is mounted and the portion in which the wafer is not mounted have different heights, and the flatness is degraded. Here, the height indicates a distance between the surface of the mounting surface 217C and the detector 210. In addition, in a case of cleaning such a mounting surface 217C, there are an area that is suitably cleaned and an area that is excessively cleaned such that the surface of the mounting surface 217C is etched, in accordance with the film thickness distribution in the mounting surface 217C. Accordingly, the flatness of the mounting surface 217C is degraded (the deformation occurs).

Next, it is determined whether or not the thickness of film (a maximum value) of the film-forming material is greater than a predetermined value from the information analyzed in step S182 (step S183). In a case where the thickness of film of the film-forming material is greater than the predetermined value, the process proceeds to step S185, and the maintenance is executed. On the other hand, in a case where the thickness of film of the film-forming material is not greater than the predetermined value, the process proceeds to step S184.

Subsequently, it is determined whether or not the crack generation or the sign of the crack generation is observed on the film-forming material from the information analyzed in step S182 (step S184). In a case where the crack generation or the sign of the crack generation is observed on the film-forming material, the process proceeds to step S185, and the maintenance is executed. On the other hand, in a case where the thickness of film of the film-forming material is not greater than the predetermined value, the process proceeds to step S186.

In step S185, the maintenance of the mounting surface 217C is executed. Specifically, cleaning gas is supplied into the process chamber 201, and the film-forming material adhering to the mounting surface 217C is cleaned. Note that, a cleaning gas supplier is not illustrated in the drawings, and the cleaning gas may be supplied from each of the already-existing nozzles, or may be supplied from a dedicated nozzle. After the cleaning of the mounting surface 217C is ended, the process returns to step S181, and the state of the film-forming material adhering to the mounting surface 217C is detected. That is, by returning to step S181, it is determined whether or not the maintenance of the mounting surface 217C is completed.

In step S186, it is determined whether or not the deformation of the mounting surface 217C is a predetermined value or more from the information analyzed in step S182. In a case where the deformation of the mounting surface 217C is the predetermined value or more, the process proceeds to step S187, a message of prompting the replacement of the rotation table 217 is sent. After that, the process proceeds to step S185, the maintenance of the mounting surface 217C is executed.

Then, the detecting step S180 is ended, and the substrate processing step is ended.

Program

A program of the first embodiment of the present disclosure is a program that causes the controller 300 serving as a computer to execute: mounting the substrate S on the mounting surface 217C of the rotation table 217 provided in the process chamber 201; performing the film-forming processing to the substrate S in the process chamber 201; and detecting the state of the film-forming material adhering to the mounting surface 217C with the detector 210.

Next, function effects of this embodiment will be described.

In the substrate processing apparatus 100 of this embodiment, the state of the film-forming material deposited on the mounting surface 217C of the substrate S is detected by the detector 210. Accordingly, the inclination of the substrate S on the mounting surface 217C due to the unevenness of the film thickness distribution of the film-forming material or the peeling of the film-forming material is suppressed, and processing uniformity of the substrate S is improved.

In addition, since the film-forming material sneaks between the mounting surface 217C and the substrate S from the outer circumference of the substrate S, the state of the film-forming material (the film) can be effectively detected by setting the outer circumference of the mounting surface 217C to be in the range of the detection region SR.

Further, the detector 210 is brought close to the gate valve 205. By bringing the detector 210 close to the gate valve 205, an adhesion state of the film-forming material of the mounting surface 217C can be promptly detected after carrying out the substrate S.

In addition, the film thickness distribution of the mounting surface 217C is obtained from the film deposition image information that is obtained by the detector 210, and the position of the substrate transferor 214 when carrying the substrate in the process chamber can be regulated from the film thickness distribution. In addition, a suitable maintenance timing can be set in accordance with the thickness of film or the crack generation situation that is obtained from the film deposition image information.

Further, since the adhesion state of the film-forming material of the mounting surface 217C is detected while moving the detector 210 in the radial direction of the rotation table 217, the film deposition image information can be accurately obtained by one detector 210.

Other Embodiments

In the embodiment described above, the film deposition image information is acquired in a state where the rotation table 217 is stopped, but the present disclosure is not limited to such a configuration. For example, the film deposition image information may be acquired in a state where the rotation table 217 is rotated. In this case, the time for performing the detecting step can be shortened.

Figure 14:
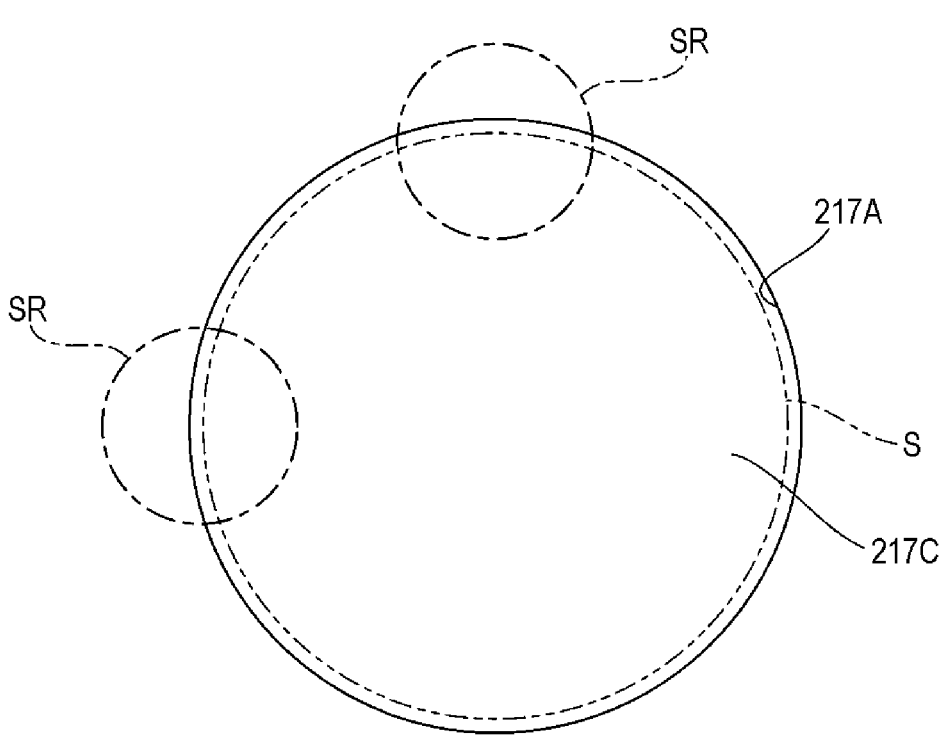
FIG. 14 is a flowchart describing a maintenance step according to the first embodiment of the present disclosure.

In the embodiment described above, the detector 210 is movable in the radial direction of the rotation table 217, but the present disclosure is not limited to such a configuration. For example, the detector 210 may be fixed in the start position. In addition, in a case where the detector 210 is fixed, as illustrated in FIG. 14, there may be a plurality of (two in FIG. 14) detectors 210. That is, the first detector 210 may be disposed in a position in which a portion on the outer circumference side of the rotation table 217 on the outer circumference of the mounting surface 217C is included in the detection region SR, and the second detector 210 may be disposed in a position in which a portion on the rotation shaft side of the rotation table 217 on the outer circumference of the mounting surface 217C is included in the detection region SR.

In the embodiment described above, the detector 210 is moved in the radial direction of the rotation table 217, but the present disclosure is not limited to such a configuration. For example, the detector 210 may be moved along the outer circumference of the mounting surface 217C, or may be moved in other forms. That is, insofar as the film deposition image information of the film-forming material adhering to the mounting surface 217C can be acquired, the movement form of the detector 210 is not limited.

In addition, a plurality of maintenance programs may be stored in the memory, an optimal maintenance program may be selected from the plurality of maintenance programs, in accordance with the thickness of film of the film in the shape of a mounting surface obtained from the film deposition image information of the mounting surface 217C, and the selected maintenance program may be executed. For example, the plurality of maintenance programs in which a maintenance time proportional to the thickness of the film formed on the mounting surface 217C is set are prepared, and in a case where the thickness of film is greater than a setting value set in advance, the corresponding maintenance program is read out from the memory and executed. According to such a configuration, the maintenance time can be optimized, and a stop time (the maintenance time) of the substrate processing apparatus can be shortened. Accordingly, a manufacturing throughput of a semiconductor device can be improved.

In addition, in the embodiment described above, a case has been described in which the $Si_2H_2Cl_2$ gas is used as the raw material gas, the $NH_3$ gas is used as the reactant gas, and the SiN film is formed on the substrate S as the nitride film, but $SiH_4$, $Si_2H_6$, $Si_3H_8$, aminosilane, and TSA gas may be used as the raw material gas. $O_2$ gas may be used as the reactant gas, and an oxide film may be formed. Other nitride films such as TaN and TiN, an oxide film such as HfO, ZrO, and SiO, and a metal film such as Ru, Ni, and W may be formed on the substrate S. Note that, in a case where a TiN film or a TiO film is formed, as the raw material gas, for example, tetrachlorotitanium ($TiCl_4$) or the like can be used.

As described above, the embodiment of the present disclosure has been described in detail, but the present disclosure is not limited to the embodiment described above, and various modifications can be made without departing from the gist of the present disclosure. For example, in a case where a position shift of the substrate S with respect to the mounting surface 217C is detected from the film deposition image information of the film-forming material deposited on the mounting surface 217C when carrying the substrate S in the process chamber, the controller 300 may control the substrate transferor 214 such that the transfer of the substrate S is retried. Accordingly, a deformation pattern of the film thickness distribution due to the position shift of the substrate S can be suppressed.

According to one aspect of the present disclosure, a state of a mounting surface of a substrate can be detected.

16

What is claimed is:

1. A substrate processing apparatus, comprising:
a process chamber performing film-forming processing to a substrate;
a substrate support that is provided in the process chamber and includes a plurality of mounting surfaces on a respective one of which the substrate is mounted; and
a detector that is disposed outside the process chamber and is configured to detect a state of a film-forming material adhering to at least one of the plurality of mounting surfaces in a non-contact manner without the substrate on the mounting surfaces, wherein the state of the film-forming material includes a film thickness distribution or a crack generation situation of the film-forming material.

2. The substrate processing apparatus according to claim 1,
wherein the detector is disposed in a position where an outer circumference of at least one of the plurality of mounting surfaces is included in a detection region of the detector.

3. The substrate processing apparatus according to claim 1,
wherein the detector is disposed in a position close to a substrate carrying-out port of the process chamber.

4. The substrate processing apparatus according to claim 1, further comprising:
a controller configured to be capable of controlling the detector to detect film deposition image information of the film-forming material adhering to at least one of the plurality of mounting surfaces, and transmit the film deposition image information to the controller.

5. The substrate processing apparatus according to claim 1, further comprising:
a rotator rotating the substrate support in the process chamber; and
a transferor that is capable of being controlled by a controller and transfers the substrate,
wherein the plurality of mounting surfaces are disposed at an interval in a rotation direction of the substrate support, and
the controller is configured to be capable of controlling the transferor such that the transfer of the substrate is retried when a position shift of the substrate with respect to at least one of the plurality of mounting surfaces is detected from film deposition image information of the at least one of the plurality of mounting surfaces.

6. The substrate processing apparatus according to claim 5,
wherein the controller obtains the film deposition image information of the at least one of the plurality of mounting surfaces and film deposition image information of a portion other than the plurality of mounting surfaces by the detector in a state in which the rotation of the substrate support by the rotator is stopped.

7. The substrate processing apparatus according to claim 5,
wherein the controller is configured to determine a maintenance timing of the substrate support, on the basis of at least one of the film deposition image information of at least one of the plurality of mounting surfaces and the film deposition image information of a portion other than the plurality of mounting surfaces.

8. The substrate processing apparatus according to claim 1, further comprising:

a plurality of the detectors, wherein a first detector of the plurality of the detectors is disposed in a position where a portion on an outer circumference side of the substrate support among the outer circumference of the at least one of the plurality of mounting surfaces is included in the detection region of the first detector, and a second detector of the plurality of the detectors is disposed in a position where a portion on a rotation shaft side of the substrate support among the outer circumference of the at least one of the plurality of mounting surfaces is included in the detection region of the second detector.

9. The substrate processing apparatus according to claim 5, wherein the detector is movable in a direction orthogonal to a rotation shaft of the substrate support, and detects the film deposition image information of the at least one of the plurality of mounting surfaces while being moved above the at least one of the plurality of mounting surfaces in the direction orthogonal to the rotation shaft.

10. The substrate processing apparatus according to claim 4, wherein the controller is configured to be capable of performing maintenance of the substrate support when a crack on the film-forming material is detected by the film deposition image information.

11. The substrate processing apparatus according to claim 4, further comprising:

a memory in which a plurality of maintenance programs are stored, wherein the controller is configured to be capable of reading out and executing a corresponding maintenance program from the memory when a thickness of film of the film-forming material on the at least one of the plurality of mounting surfaces that is obtained from the film deposition image information of the at least one of the plurality of mounting surfaces is greater than a setting value set in advance.

12. The substrate processing apparatus according to claim 11, further comprising:

an input/output capable of displaying and editing at least one of the plurality of maintenance programs.

13. The substrate processing apparatus according to claim 4, wherein the controller acquires the film deposition image information by the detector after maintenance of the at least one of the plurality of mounting surfaces, and determines whether or not the maintenance is completed.

14. The substrate processing apparatus according to claim 4, wherein the controller obtains a distance between each of the plurality of mounting surfaces and the detector from the film deposition image information of the plurality of mounting surfaces to calculate deformation of each of the plurality of mounting surfaces.

15. The substrate processing apparatus according to claim 14, wherein the controller sends a message of prompting replacement of the substrate support when the deformation of at least one of the plurality of mounting surfaces becomes a predetermined value or more.

16. The substrate processing apparatus according to claim 14, wherein the controller cleans the at least one of the plurality of mounting surfaces when the deformation of at least one of the plurality of mounting surfaces becomes the predetermined value or more, and after the cleaning, acquires the film deposition image information of the at least one of plurality of mounting surfaces and derives the deformation of each of the plurality of mounting surfaces.

17. The substrate processing apparatus according to claim 4, wherein the controller continuously acquires the film deposition image information in a state in which the substrate support is rotated.

18. The substrate processing apparatus according to claim 5, wherein the detector is rotatively movable in a direction identical to the rotation direction of the substrate support or is movable in the direction orthogonal to a rotation shaft of the substrate support, and the controller continuously acquires the film deposition image information in a state in which the detector is moved.

19. A method of processing a substrate, comprising:

mounting a plurality of substrates on a plurality of mounting surfaces each capable of mounting a respective single substrate, wherein the plurality of mounting surfaces are included on a substrate support provided in a process chamber;

performing film-forming processing to the plurality of substrates in the process chamber; and detecting a state of a film-forming material adhering to at least one of the plurality of mounting surfaces in a non-contact manner without the substrate on the mounting surfaces with a detector, wherein the state of the film-forming material includes a film thickness distribution or a crack generation situation of the film-forming material.

20. A non-transitory computer-readable recording medium storing a program that causes, by a computer, a substrate processing apparatus to perform a process comprising:

mounting a plurality of substrates on a plurality of mounting surfaces each capable of mounting a respective single substrate, wherein the plurality of mounting surfaces are included on a substrate support provided in a process chamber;

performing film-forming processing to the plurality of substrates in the process chamber; and detecting a state of a film-forming material adhering to at least one of the plurality of mounting surfaces in a non-contact manner without the substrate on the mounting surfaces with a detector, wherein the state of the film-forming material includes a film thickness distribution or a crack generation situation of the film-forming material.

21. A method of manufacturing a semiconductor device comprising the method of claim 19.

22. The substrate processing apparatus according to claim 1, wherein the detector detects the state after the substrate is removed from the process chamber.

23. The substrate processing apparatus according to claim 1, wherein the detector detects the state after a supply of gas to the process chamber is stopped.

24. The substrate processing apparatus according to claim 1, wherein the detector is configured to be located in proximity to a gate valve.

* * * * *